United States Patent
Dietrich et al.

(10) Patent No.: US 6,351,419 B1
(45) Date of Patent: Feb. 26, 2002

(54) INTEGRATED MEMORY WITH A BLOCK WRITING FUNCTION AND GLOBAL AMPLIFIERS REQUIRING LESS SPACE

(75) Inventors: Stefan Dietrich, Türkenfeld; Peter Schrögmeier, München; Sabine Schöniger, Miesbach; Christian Weis, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/580,986

(22) Filed: May 30, 2000

(30) Foreign Application Priority Data

May 27, 1999 (DE) .......................................... 199 24 288

(51) Int. Cl.[7] ................................................ G11C 7/00
(52) U.S. Cl. .................................. 365/189.04; 365/205
(58) Field of Search ........................... 365/189.04, 205, 365/208, 207

(56) References Cited

U.S. PATENT DOCUMENTS

| 5,781,496 A | 7/1998 | Pinkham et al. ........ 365/230.03 |
| 5,787,046 A | 7/1998 | Furuyama et al. ...... 365/230.03 |
| 6,009,024 A | * 12/1999 | Hirata et al. ................. 365/190 |

* cited by examiner

Primary Examiner—David Nelms
Assistant Examiner—M. Tran
(74) Attorney, Agent, or Firm—Herbert L. Lerner; Laurence A. Greenberg; Werner H. Stemer

(57) ABSTRACT

An integrated memory has a first operating mode, in which, during each write access, only one of the two global amplifiers is active and transmits a datum via one of the local amplifiers to the corresponding bit line. Moreover, the memory has a second operating mode, in which, during each write access, both global amplifiers are simultaneously active and transmit a common datum via in each case at least one of the local amplifiers to the corresponding bit lines.

4 Claims, 2 Drawing Sheets

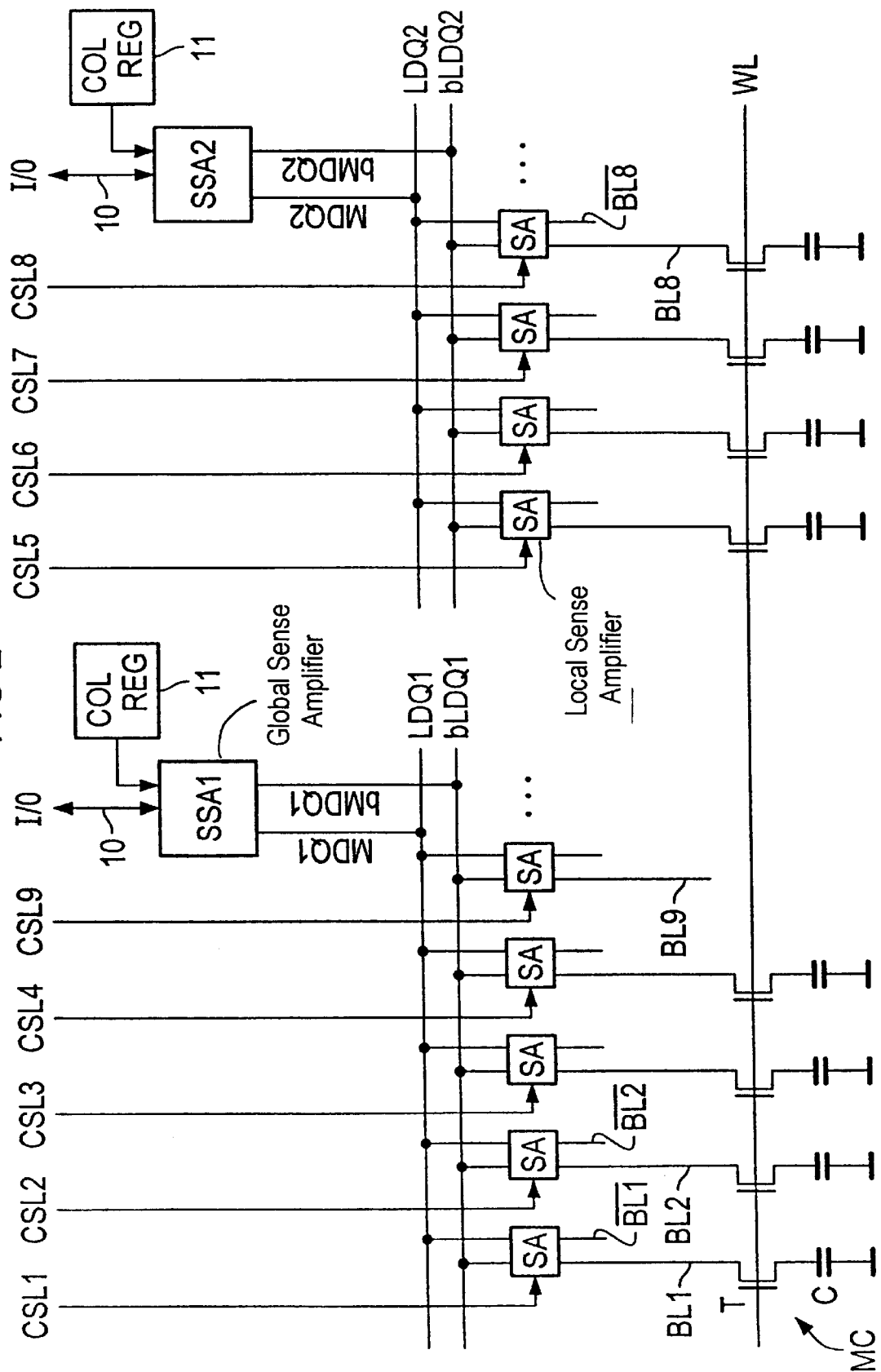

INTEGRATED MEMORY WITH A BLOCK WRITING FUNCTION AND GLOBAL AMPLIFIERS REQUIRING LESS SPACE

BACKGROUND OF THE INVENTION

FIELD OF THE INVENTION

The invention relates to an integrated memory having global amplifiers which are each assigned a plurality of local amplifiers which serve for amplifying signals present on bit lines of the memory.

Synchronous graphics random access memories (SGRAMs) are special DRAMs (Dynamic RAMs) for graphics applications. Usually, during normal operation, a datum is written to one of the memory cells via one of the global amplifiers and one of the local amplifiers. In this case, the local amplifiers assigned to the same global amplifier are connected thereto via common local data lines. SGRAMs furthermore have a block writing operating mode, in which a datum from a color register is simultaneously written to a plurality of memory cells which, during a normal memory access, are not accessed simultaneously but rather one after the other.

The block writing operating mode serves for writing the same datum from the color register to a plurality of memory cells which are connected to the same word line and are assigned successive column addresses. In this way, a uniform screen color can be generated relatively rapidly for a monitor that is driven by a graphics memory.

Memories of this type are usually constructed in such a way that bit lines which are assigned successive addresses are disposed adjacent to one another. One possibility for carrying out the block writing function consists in simultaneously activating the desired number of local amplifiers connected to the same global amplifier (instead of activating just one of the local amplifiers of the respectively active global amplifier, as in the normal operating mode).

In order to ensure, however, that the global amplifier in the block writing operating mode, can simultaneously supply data for a large number of active local amplifiers, it must be given sufficiently large dimensions, which results in a corresponding large space requirement.

SUMMARY OF THE INVENTION

It is accordingly an object of the invention to provide an integrated memory with a block writing function that overcomes the above-mentioned disadvantages of the prior art devices of this general type, in which the global amplifiers require less space. With the foregoing and other objects in view there is provided, in accordance with the invention, an integrated memory, including word lines; bit lines intersecting the word lines; memory cells disposed at crossover points of the bit lines and the word lines; local amplifiers connected in each case to at least one of the bit lines; and at least two global amplifiers connected in each case to a plurality of the local amplifiers, in a first operating mode during each write access only one of the two global amplifiers being active and transmitting a datum via one of the local amplifiers to a corresponding one of the bit lines, and in a second operating mode during the write access two of the global amplifiers being simultaneously active and transmitting a common datum via in each case at least one of the local amplifiers to corresponding ones of the bit lines.

The memory according to the invention has a first operating mode, in which, during each write access, only one of the two global amplifiers is simultaneously active and transmits a datum via one of the local amplifiers to the corresponding bit line. Moreover, it has a second operating mode, in which, during each write access, both global amplifiers are simultaneously active and transmit a common datum via in each case at least one of the local amplifiers to the corresponding bit lines.

In the case of the memory according to the invention, more global amplifiers are simultaneously active in the second operating mode, which may be a block writing operating mode for example, than in the first operating mode. Therefore, the common datum is simultaneously written to a plurality of memory cells not by a single active global amplifier but by a plurality of global amplifiers. If the number of memory cells that are to be written to simultaneously is prescribed, and thus so is the number of local amplifiers that are to be activated simultaneously during the block writing operation, in the case of the invention each global amplifier has to drive, simultaneously, significantly fewer active local amplifiers compared with the case where all of the local amplifiers that are to be activated simultaneously would be driven by only one global amplifier. The capacitive loading on the global amplifier rises with the number of active local amplifiers that the global amplifier has to drive simultaneously. Since the invention makes it possible, therefore, to reduce the capacitive loading on the global amplifiers in the block writing operating mode, the global amplifiers can be given correspondingly smaller dimensions. This leads to a reduction in the space requirement of the global amplifiers and hence to an overall decrease in the space requirement of the integrated circuit.

In accordance with an added feature of the invention, there are column select lines transmitting column addresses and connected to the local amplifiers, the bit lines are selected by use of the column addresses, and the bit lines which, in the second operating mode, are accessed simultaneously via the two of the global amplifiers during the write access are assigned successive ones of the column addresses.

In according with an additional feature of the invention, there is a memory unit for storing the datum and connected to the global amplifiers. In addition, a data input is connected to the global amplifiers and, through which, in the first operating mode, the datum to be written in can be fed to the global amplifiers without being stored in the memory unit, and the global amplifiers in the second operating mode, simultaneously transmitting the datum stored in the memory unit through in each case at least one of the local amplifiers to the corresponding bit lines.

In accordance with a concomitant feature of the invention, during the second operating mode and during the write access, all of the global amplifiers transmit the common datum simultaneously through in each case a plurality of the local amplifiers to the corresponding ones of the bit lines.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a block circuit diagram of an enlarged detail of the memory shown in FIG. 1.

DESCRIPTION OF THE PREFERRED EMBODIMENTS

Figure 1:
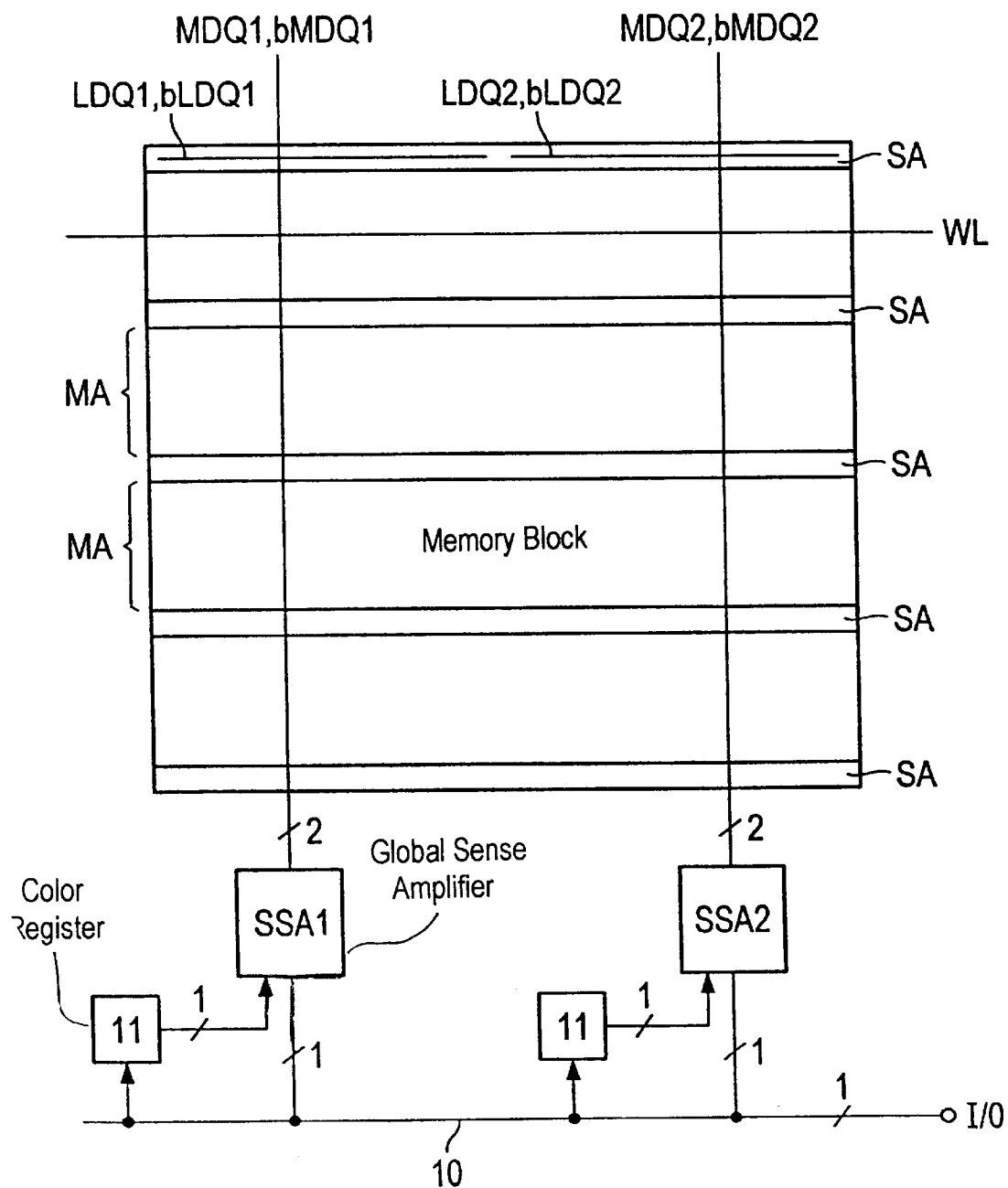
FIG. 1 is a block diagram of an exemplary embodiment of a memory according to the invention.

In all the figures of the drawing, sub-features and integral parts that correspond to one another bear the same reference symbol in each case. Referring now to the figures of the drawing in detail and first, particularly, to FIG. 1 thereof, there is shown an integrated memory of the synchronous graphics random access memory (SGRAM) type. In the case of the memory, a smaller number of lines and memory blocks are illustrated than is the case in reality, in order to be able to explain the invention more simply. The memory has four memory blocks MA, which are separated from one another by intervening strips of local sense amplifiers SA. Local data lines LDQi, bLDQi are disposed in each sense amplifier strip, and are connected via the local sense amplifiers SA to bit line pairs that are not illustrated in FIG. 1. Word lines WL of the memory run in a horizontal direction in each of the memory blocks MA. Global data lines MDQi, bMDQi extend across the four memory blocks MA in a vertical direction. The local sense amplifiers SA are connected to two global sense amplifiers SSA1, SSA2 via the local data lines LDQi, bLDQi and the global data lines MDQi, bMDQi. The global sense amplifiers SSAi are connected via a further data line 10 to a data terminal I/O of the memory. Each of the global sense amplifiers SSAi is assigned a color register or memory unit 11 for storing a common datum. The common datum can be written simultaneously to the two color registers 11 via the data terminal I/O and the data line 10.

In a first operating mode (normal operating mode), during a write access, a datum that is fed via the data terminal I/O and the data line 10 is written to one of the memory cells of the memory via one of the global sense amplifiers SSAi and one of the local sense amplifiers SA. In a second operating mode (block writing operating mode), the common datum that has previously been stored in the color registers 11 is simultaneously written to a plurality of memory cells simultaneously via both global sense amplifiers SSAi and in each case a plurality of the local sense amplifiers SA.

FIG. 2 shows a detail of the memory shown in FIG. 1. One of the word lines WL and also the associated local sense amplifiers SA are illustrated for one of the memory blocks MA. The local sense amplifiers SA are connected to a respective bit line pair BLi,/BLi. Memory cells MC of the memory are disposed at crossover points in the bit lines and the word lines WL. In FIG. 2, only one of the memory cells MC in each case has been illustrated for each bit line pair. Each of the memory cells MC has a selection transistor T and a storage capacitor C. One electrode of the storage capacitor C is connected to ground and the other electrode is connected to the associated bit line BLi via the associated selection transistor T. A control terminal of the selection transistor T is connected to the associated word line WL.

FIG. 2 also shows the local data line pairs LDQi, bLDQi and the global data line pairs MDQI, bMDQi. Via these, the local sense amplifiers SA are connected to the global sense amplifiers SSAi. The local sense amplifiers SA and the global sense amplifiers SSAi are differential amplifiers. Each local sense amplifier SA is assigned a column select line CSLi. The latter can be selected by column addresses. Each local data line pair LDQi, bLDQi is connected to a large number of local sense amplifiers SA.

In the first operating mode, only one of the column select lines CSLi is brought to a high level. By this, the associated local sense amplifier SA is selected and is conductively connected to the associated local data line pair LDQi, bLDQi. At the same time, the global sense amplifier SSAi assigned to the local sense amplifier SA is activated. During a write access, the datum is then transmitted from the data line 10 via the active global sense amplifier SSAi and the selected local sense amplifier SA to the bit line pair BLi,/BLi connected to the latter. From there, the datum is written to the memory cell MC that has been selected via the respectively addressed word line WL. The local sense amplifier SA that has been selected via its column select line CSLi is referred to below as "active sense amplifier".

In the second operating mode, eight of the column select lines CSLi, which are assigned successive column addresses, are activated simultaneously. By way of example, the four column select lines CSL1 to CSL4 of the left-hand local data line pair LDQ1, bLDQ1 and the four column select lines CSL5 to CSL8 of the right-hand local data line pair LDQ2, bLDQ2 are activated simultaneously. Therefore, the associated eight local sense amplifiers SA are activated simultaneously. Moreover, the two global sense amplifiers SSAi are activated. A common datum that has been previously stored in the color registers 11 is then transmitted via both global sense amplifiers SSAi and the eight simultaneously active local sense amplifiers SA to the eight bit line pairs connected to the latter. The common datum is then written simultaneously to the eight memory cells MC which are connected to the bit line pairs and to the respectively activated word line WL.

Although eight of the local sense amplifiers SA are simultaneously active in the block writing operating mode, each of the global sense amplifiers SSAi only have to drive four of the sense amplifiers in each case. Therefore, the global sense amplifiers SSAi only have to be dimensioned to be strong enough that they can drive four active local sense amplifiers SA simultaneously.

Since, in the second operating mode, bit lines which are assigned successive column addresses are accessed simultaneously, it is important that the bit lines are not disposed successively in address terms, as is the case in conventional memories. Rather, as can be gathered from FIG. 2, only in each case four of the eight bit line pairs BLi,/BLi that are to be selected simultaneously and their associated column select lines CSLi are disposed directly adjacent to one another, while the two groups of four containing bit line pairs to be selected simultaneously and associated column select lines are not disposed adjacent to one another. This is due to the fact that they are connected to different local data lines LDQi, bLDQi in each case. The column select lines CSL1 to CSL8 that are to be activated simultaneously during the block writing operation in FIG. 2 are assigned, for example, the first eight successive column addresses. Disposed adjacent to the fourth column select line CSL4, however, is not the fifth column select line CSL5, but a ninth column select line CSL9 (and also further column select lines that are not illustrated), which is assigned the ninth column address. The same applies to the remaining column select lines, local sense amplifiers and bit line pairs, which are only indicated by dots in FIG. 2.

Instead of the two color registers 11 in FIG. 2 which are each assigned to one of the global sense amplifiers SSAi, in other exemplary embodiments of the invention it is also possible to provide a single color register 11. The latter may then transmit a stored, common datum simultaneously to both global sense amplifiers SSAi for example via the data line 10 in the block writing operating mode.

Although the invention has been explained above only for a memory that has merely two local data line pairs LDQi, bLDQi and two global sense amplifiers SSAi, the number thereof can, of course, also assume other values. Moreover, it is possible for the local and global sense amplifiers not to be differential amplifiers but rather single-input amplifiers, so that, instead of the bit line pairs, local data line pairs and global data line pairs only single lines in each case are connected to the respective amplifier SA, SSAi.

Although the global sense amplifiers SSAi can be given relatively small dimensions in the case of the invention, it is not necessary to provide a larger number of global sense amplifiers than in the case of conventional memories. This is because each local amplifier SA connected to one of the global amplifiers SSAi constitutes a capacitive load for the associated global sense amplifier SSAi during a write access, even if it is not active. Therefore, even in conventional memories it is already the case that the number of local amplifiers assigned to each global amplifier must be limited.

The invention advantageously exploits this in that a larger number of global amplifiers SSAi are activated in the second operating mode than in the first operating mode.

The local sense amplifiers SA and also the global sense amplifiers SSAi can be constructed as in conventional DRAMs.

We claim:

1. An integrated memory, comprising:

word lines;

bit lines intersecting said word lines;

memory cells disposed at crossover points of said bit lines and said word lines;

local amplifiers connected in each case to at least one of said bit lines; and at least two global amplifiers connected in each case to a plurality of said local amplifiers, in a first operating mode during each write access only one of said two global amplifiers being active and transmitting a datum via one of said local amplifiers to a corresponding one of said bit lines, and in a second operating mode during the write access two of said global amplifiers being simultaneously active and transmitting a common datum via in each case at least one of said local amplifiers to corresponding ones of said bit lines.

2. The integrated memory according to claim 1, including column select lines transmitting column addresses and connected to said local amplifiers, said bit lines being selected by use of the column addresses, and said bit lines which, in the second operating mode, are accessed simultaneously via said two of said global amplifiers during the write access are assigned successive ones of said column addresses.

3. The integrated memory according to claim 1, including:

a memory unit for storing the datum and connected to said global amplifiers; and a data input connected to said global amplifiers and, through which, in the first operating mode, the datum to be written in can be fed to said global amplifiers without being stored in said memory unit, and said global amplifiers in the second operating mode, simultaneously transmitting the datum stored in said memory unit through in each case at least one of said local amplifiers to said corresponding bit lines.

4. The integrated memory according to claim 1, wherein during the second operating mode and during the write access, all of said global amplifiers transmit the common datum simultaneously through in each case a plurality of said local amplifiers to said corresponding ones of said bit lines.

* * * * *